(12) United States Patent
Ghosh et al.

(10) Patent No.: US 11,728,620 B2
(45) Date of Patent: Aug. 15, 2023

(54) SEMICONDUCTOR DEVICES AND METHODS FOR PRODUCING THE SAME

(71) Applicant: Princeton Optronics, Inc., Mercerville, NJ (US)

(72) Inventors: Chuni Ghosh, West Windsor, NJ (US); Guoyang Xu, Mercerville, NJ (US); Qing Wang, Singapore (SG)

(73) Assignee: Princeton Optronics, Inc., Mercerville, NJ (US)

( * ) Notice: Subject to any disclaimer, the term of this patent is extended or adjusted under 35 U.S.C. 154(b) by 377 days.

(21) Appl. No.: 16/956,156

(22) PCT Filed: Dec. 26, 2018

(86) PCT No.: PCT/US2018/067525
§ 371 (c)(1),
(2) Date: Jun. 19, 2020

(87) PCT Pub. No.: WO2019/133624
PCT Pub. Date: Jul. 4, 2019

(65) Prior Publication Data
US 2021/0119414 A1 Apr. 22, 2021

Related U.S. Application Data

(60) Provisional application No. 62/610,652, filed on Dec. 27, 2017.

(51) Int. Cl.
*H01S 5/042* (2006.01)
*H01S 5/0236* (2021.01)
(Continued)

(52) U.S. Cl.
CPC .......... *H01S 5/0421* (2013.01); *H01S 5/0201* (2013.01); *H01S 5/023* (2021.01);
(Continued)

(58) Field of Classification Search
CPC ....... H01S 5/023–0234; H01S 5/04254; H01S 5/183–18397; H01S 5/0421;
(Continued)

(56) References Cited

U.S. PATENT DOCUMENTS 5,305,340 A * 4/1994 Antreasyan ........... H01S 5/0234
372/50.1
5,693,568 A * 12/1997 Liu ................... H01L 21/76897
438/618

(Continued)

FOREIGN PATENT DOCUMENTS

DE 102018101392 A1 * 7/2018 ............. H01L 21/28
JP 2006222196 A 8/2006
(Continued)

OTHER PUBLICATIONS

Office Action issued from the Taiwan Patent Office for related Application No. 107147134 dated Mar. 24, 2022 (5 Pages including the Statement of Relevance).
(Continued)

*Primary Examiner* — Joshua King
(74) *Attorney, Agent, or Firm* — Michael Best & Friedrich LLP (57) ABSTRACT

Semiconductor devices, such as vertical-cavity surface-emitting lasers, and methods for manufacturing the same, are disclosed. The semiconductor devices include contact extensions and electrically conductive adhesive material, such as fusible metal alloys or electrically conductive composites. In some instances, the semiconductor devices further include structured contacts. These components enable the production of semiconductor devices having minimal distortion. For example, arrays of vertical-cavity surface-emitting lasers can be produced exhibiting little to no
(Continued)

bowing. Semiconductor devices having minimal distortion exhibit enhanced performance in some instances.

10 Claims, 3 Drawing Sheets

(51) Int. Cl.
*H01S 5/023* (2021.01)
*H01S 5/02* (2006.01)
*H01S 5/183* (2006.01)
*H01S 5/42* (2006.01)
*H01S 5/34* (2006.01)
*H01S 5/0237* (2021.01)

(52) U.S. Cl.
CPC ........ *H01S 5/0236* (2021.01); *H01S 5/04254* (2019.08); *H01S 5/18305* (2013.01); *H01S 5/3406* (2013.01); *H01S 5/423* (2013.01); H01L 2224/02165 (2013.01); H01L 2224/05557 (2013.01); *H01S 5/0237* (2021.01); *H01S 5/04252* (2019.08)

(58) Field of Classification Search
CPC ... H01S 5/04252; H01S 5/0425–04257; H01S 5/02335–0234
See application file for complete search history.

(56) References Cited

U.S. PATENT DOCUMENTS

| | | | | |
|---|---|---|---|---|
| 6,141,365 | A * | 10/2000 | Bowler | H01S 5/22 372/45.01 |
| 7,075,113 | B2 * | 7/2006 | Wu | H01L 33/40 257/766 |
| 7,215,692 | B2 * | 5/2007 | Jewell | H04L 67/34 257/E33.069 |
| 10,205,303 | B1 * | 2/2019 | Hegblom | H01S 5/183 |
| 2003/0165169 | A1 * | 9/2003 | Nomoto | H01S 5/04254 372/46.01 |
| 2005/0014349 | A1 * | 1/2005 | Carey | H01S 5/18305 438/47 |
| 2005/0094695 | A1 * | 5/2005 | Trezza | H01S 5/18305 372/50.1 |
| 2007/0104237 | A1 * | 5/2007 | Matsumoto | H01S 5/04252 372/43.01 |
| 2007/0275492 | A1 | 11/2007 | Huffaker et al. | |
| 2008/0031295 | A1 * | 2/2008 | Tanaka | H01L 33/0093 438/46 |
| 2009/0302470 | A1 * | 12/2009 | Tada | H01L 29/452 257/745 |
| 2010/0283069 | A1 * | 11/2010 | Rogers | H01L 31/0288 257/E31.127 |
| 2011/0150023 | A1 * | 6/2011 | Higuchi | H01S 5/34333 372/50.1 |
| 2013/0163627 | A1 * | 6/2013 | Seurin | H01S 5/02345 372/36 |
| 2013/0221324 | A1 * | 8/2013 | Lee | H01L 33/40 438/47 |
| 2013/0266326 | A1 * | 10/2013 | Joseph | H04B 10/1141 398/130 |
| 2015/0146749 | A1 * | 5/2015 | Hoshino | H01S 5/04257 372/36 |
| 2015/0255955 | A1 * | 9/2015 | Wang | H01S 5/0234 438/29 |
| 2016/0308333 | A1 | 10/2016 | Maeda et al. | |
| 2017/0162522 | A1 | 6/2017 | Chang et al. | |
| 2017/0170306 | A1 * | 6/2017 | Nakayama | H01L 29/66431 |
| 2018/0061931 | A1 * | 3/2018 | Shreiber | H01L 28/55 |
| 2019/0109436 | A1 * | 4/2019 | Hegblom | H01S 5/18313 |

FOREIGN PATENT DOCUMENTS

| | | | | |
|---|---|---|---|---|
| JP | 2009267336 A | * | 11/2009 | ......... H01L 31/0749 |
| JP | 2011138928 A | * | 7/2011 | ............... H01B 1/16 |
| JP | 2014022743 A | * | 2/2014 | ......... H01L 21/2885 |
| JP | 2015103783 A | * | 6/2015 | ......... H01S 5/02476 |
| WO | WO-03026082 A2 | * | 3/2003 | ......... G02B 19/0014 |
| WO | WO-2006090990 A1 | * | 8/2006 | ............. B82Y 20/00 |
| WO | WO-2017169086 A1 | * | 10/2017 | ............. H01L 21/28 |

OTHER PUBLICATIONS

International Preliminary Report on Patentability for related Application No. PCT/US2018/067525 dated Jun. 30, 2020 (8 Pages).
International Search Report and Written Opinion for Application No. PCT/US2018/067525 dated Apr. 24, 2019 (11 pages).

* cited by examiner

SEMICONDUCTOR DEVICES AND METHODS FOR PRODUCING THE SAME

CROSS-REFERENCE TO RELATED APPLICATIONS

This application is the U.S. national stage entry, under 35 U.S.C. § 371, of International Application No. PCT/US2018/067525, filed Dec. 26, 2018, which claims priority to U.S. Provisional Patent Application Ser. No. 62/610,652, filed on Dec. 27, 2017, the contents of which are incorporated herein by reference in their entirety.

BACKGROUND

Semiconductor devices can include components having intrinsic stresses. For example, epitaxially grown layers can exhibit a lattice parameter mismatch with the substrate on which the layers are grown. The mismatch results in strain, for example, occurring within the vicinity of the interface between the two components. Moreover, in some instances, thermal expansion coefficients of various components within the semiconductor devices can be significantly different from one anther, thereby leading to thermal stresses during manufacturing or operation of the semiconductor devices. These effects can induce a measurable distortion (e.g., bowing) in the semiconductor devices. The distortion can be significant in arrays or wafers of semiconductor devices. The distortion can be particularly problematic for applications requiring substantially flat (distortion-free) arrays of semiconductor devices.

Strain compensation layers are known in the art. However, strain compensation layers, such as dielectric strain compensation layers, can be cumbersome to implement in some instances. Thus, alternative solutions are needed.

SUMMARY

This disclosure describes semiconductor devices, such as discrete semiconductor devices or arrays of semiconductor devices, exhibiting little to no distortion, and methods for producing the same. In one aspect, for example, a semiconductor device includes a substrate with first and second opposing sides, and an epitaxial layer with first and second opposing sides. The first side of the epitaxial layer abuts the first side of the substrate.

The semiconductor device further includes a substrate contact abutting the second side of the substrate, an epitaxial contact abutting the second side of the epitaxial layer, and a submount. The submount is mounted to a submount contact with an electrically conductive material. In some instances, the submount contact is the epitaxial contact. In some instances, the submount contact is the substrate contact.

The semiconductor device further includes an obverse submount contact. In some instances, the obverse submount contact is the epitaxial contact that is not associated with the submount contact. In some instances, the obverse submount contact is the substrate contact that is not associated with the submount contact. The semiconductor device further includes a contact extension abutting the obverse submount contact.

In some implementations, the semiconductor device includes a structured extension abutting the submount contact.

In some implementations, the contact extension is composed of the same material as the obverse submount contact, and the contact extension characterized by a substantially similar microstructure as the obverse submount contact.

In some implementations, the contact extension is composed of the same material as the obverse submount contact, and the contact extension is characterized by a substantially dissimilar microstructure as the obverse submount contact.

In another aspect, an array of semiconductor devices includes a substrate with first and second opposing sides, and an epitaxial layer with first and second opposing sides. The first side of the epitaxial layer abuts the first side of the substrate. The first side of the substrate and the first side of the epitaxial layer are characterized by intrinsic stresses within the vicinity of the first side of the substrate and the first side of the epitaxial layer.

The array of semiconductor devices further includes a substrate contact abutting the second side of the substrate, an epitaxial contact abutting the second side of the epitaxial layer, and a submount. The submount is mounted to a submount contact with an electrically conductive material. The submount contact is either the epitaxial contact or the substrate contact. The electrically conductive adhesive material is characterized by a melting temperature below which the electrically conductive adhesive material is substantially solid.

The array of semiconductor devices further includes an obverse submount contact. In some instances, the obverse submount contact is the epitaxial contact that is not associated with the submount contact. In some instances, the obverse submount contacts is the substrate contact that is not associated with the submount contact. The array of semiconductor devices further includes a contact extension abutting the obverse submount contact, and a plurality of isolating components within the epitaxial layer. The isolating components delineate each semiconductor device within the array of semiconductor devices.

In some implementations, the contact extension is operable to counteract the intrinsic stresses within the vicinity of the first side of the substrate and the first side of the epitaxial layer such that the array of semiconductor devices adopts a form that is substantially planar above the melting temperature of the electrically conductive adhesive material.

In some implementations, the electrically conductive adhesive material is operable to fix the array of semiconductor devices into the form that is substantially planar below the melting temperature of the electrically conductive adhesive material.

In some implementations, the array of semiconductor device further includes a structured extension abutting the submount contact.

In another aspect, the disclosure describes a method for manufacturing semiconductor devices. The method can include the following:

mounting an assembly onto an assembly holder, the assembly comprising a substrate
having first and second opposing sides; and an epitaxial layer having first and second opposing sides, the first side of the epitaxial layer abutting the first side of the substrate, and the second side of the substrate abutting the assembly holder;

depositing an epitaxial contact onto the second side of the epitaxial layer;

depositing a contact extension onto the epitaxial contact;

mounting the assembly, the epitaxial contact, and contact extension onto a chuck such that the epitaxial layer, epitaxial contact, and contact extension are adjacent to the chuck;

dismounting the assembly, epitaxial contact, contact extension, and chuck from the assembly holder;
removing portions of the substrate from the second side of the substrate;
depositing a substrate contact onto the second side of the substrate;
positioning the substrate contact, the assembly, the epitaxial contact, contact extension, and chuck onto a submount such that the submount is adjacent to the second side of the substrate and the substrate contact, the submount being positioned with an electrically conductive material between portions of the substrate contact and the submount;
heating the submount, the substrate contact, the assembly, the epitaxial contact, the contact extension, the chuck, and the electrically conductive material to an elevated temperature at or above the melting temperature of the electrically conductive material;
cooling the submount, the substrate contact, the assembly, the epitaxial contact, the contact extension, the chuck, and the electrically conductive material to a temperature below the elevated temperature;
dismounting the submount, the substrate contact, the assembly, the epitaxial contact, the contact extension, and the electrically conductive material from the chuck; and
dicing the submount, the substrate contact, the assembly, the epitaxial contact, the contact extension, and the electrically conductive material into a plurality of semiconductor devices, an array of semiconductor devices, or a plurality of arrays of semiconductor devices.

In some implementations, the method for manufacturing semiconductor devices further includes depositing a structured extension onto the substrate contact.

In some implementations, mounting the assembly, the epitaxial contact, and contact extension onto a chuck includes depositing an organic compound between the chuck and the epitaxial layer, epitaxial contact, and contact extension.

In some implementations, depositing the contact extension includes depositing the contact extension by electrodeposition, physical vapor deposition or chemical vapor deposition.

In some implementations, depositing the structured extension includes depositing the structured extension by electrodeposition, physical vapor deposition or chemical vapor deposition.

In some implementations, depositing the epitaxial contact and/or the substrate contact includes depositing the contacts by electrodeposition, physical vapor deposition or chemical vapor deposition.

In another aspect, a method for manufacturing semiconductor devices can include the following:
mounting an assembly onto an assembly holder, the assembly comprising a substrate having first and second opposing sides; and an epitaxial layer having first and second opposing sides, the first side of the epitaxial layer abutting the first side of the substrate, and the second side of the epitaxial layer abutting the assembly holder;
depositing a substrate contact onto the second side of the epitaxial layer;
depositing a contact extension onto the substrate contact;
mounting the assembly, the substrate contact, and contact extension onto a chuck such that the substrate, substrate contact, and contact extension are adjacent to the chuck;
dismounting the assembly, substrate contact, contact extension, and chuck from the assembly holder;
depositing an epitaxial contact onto the second side of the epitaxial layer;
positioning the epitaxial contact, the assembly, the substrate contact, contact extension, and chuck onto a submount such that the submount is adjacent to the second side of the epitaxial layer and the epitaxial contact, the submount being positioned with an electrically conductive material between portions of the epitaxial contact and the submount;
heating the submount, the epitaxial contact, the assembly, the substrate contact, the contact extension, the chuck, and the electrically conductive material to an elevated temperature at or above the melting temperature of the electrically conductive material;
cooling the submount, the epitaxial contact, the assembly, the substrate contact, the contact extension, the chuck, and the electrically conductive material to a temperature below the elevated temperature;
dismounting the submount, the epitaxial contact, the assembly, the substrate contact, the contact extension, and the electrically conductive material from the chuck; and
dicing the submount, the epitaxial contact, the assembly, the substrate contact, the contact extension, and the electrically conductive material into a plurality of semiconductor devices, an array of semiconductor devices, or a plurality of arrays of semiconductor devices.

In some implementations, the method includes depositing a structured extension onto the epitaxial contact.

In some implementations, mounting the assembly, the substrate contact, and contact extension onto a chuck includes depositing an organic compound between the chuck and the substrate, substrate contact, and contact extension.

In some implementations, depositing the contact extension includes depositing the contact extension by electrodeposition, physical vapor deposition or chemical vapor deposition.

In some implementations, depositing the structured extension includes depositing the structured extension by electrodeposition, physical vapor deposition or chemical vapor deposition.

In some implementations, depositing the epitaxial contact and/or the substrate contact includes depositing the contacts by electrodeposition, physical vapor deposition or chemical vapor deposition.

Other aspects, features and advantages will be apparent from the following detailed description, the accompanying drawings and the claims.

DETAILED DESCRIPTION

Figure 1A:
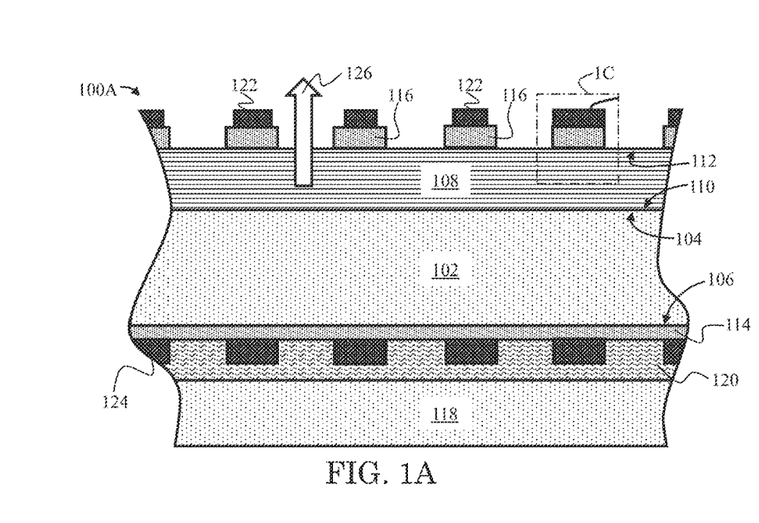
FIG. 1A depicts an example array of semiconductor devices in which the semiconductor devices are illustrated as an array of top-emitting vertical-cavity surface-emitting lasers.
Figure 1B:
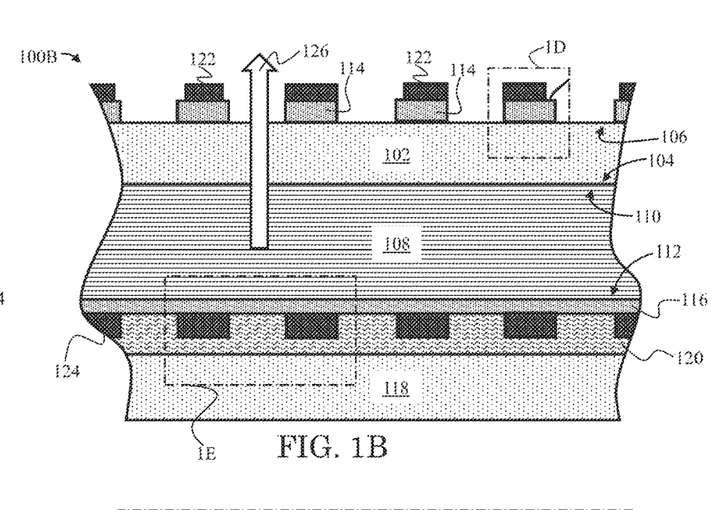
FIG. 1B depicts another example array of semiconductor devices in which the semiconductor devices are illustrated as an array of bottom-emitting vertical-cavity surface-emitting lasers.

FIGS. 1A and 1B depict example arrays of semiconductor device 100A, 100B, respectively. The array of semiconductor devices 100A is a top-emitting vertical-cavity surface-emitting laser, and the array of semiconductor device 100B is a bottom-emitting vertical-cavity surface-emitting laser. The following components disclosed herein are applicable to both types of vertical-cavity surface-emitting laser, as well as other semiconductor devices or arrays of semiconductor devices.

The following description refers to arrays of semiconductor devices, such as wafers of semiconductor devices or a smaller plurality of semiconductor devices designed to operate as a single device or module, the description is applicable to individual or discrete semiconductor devices separated (e.g., diced) from the arrays of semiconductor devices.

FIGS. 1A and 1B include equivalent components and are referred to simultaneously in the following description. Some components, though positioned differently with respect to other components, are described using a common component name. Their common component name indicates their position with respect to a common component, the position of which is invariant in both arrays of semiconductor devices 100A, 100B. For example, a submount contact is a substrate contact in the embodiment depicted in FIG. 1A, and an epitaxial contact in the embodiment depicted in FIG. 1B. The common component name, submount contact in this example, is used in both embodiments to refer to the position of the substrate contact; that is, adjacent to the submount in the first embodiment, and not adjacent to the submount in the second embodiment; hence, the submount contact position is adjacent to the submount in any embodiment.

The arrays of semiconductor devices 100A and 100B each include a substrate 102 having first 104 and second 106 opposing sides, and an epitaxial layer 108 having first 110 and second 112 opposing sides. The substrate 102 and the epitaxial layer 108 can each be composed, for example, of crystalline, polycrystalline, or amorphous semiconducting or insulating material, such as gallium arsenide, aluminum gallium arsenide, indium antimonide, or silicon.

The compositions and thicknesses of the substrate 102 and the epitaxial layer 108 depend on the intended application of the semiconductor device and thus can vary in different implementations. For example, the substrate 102 can be composed of gallium arsenide that is 10-200 microns thick, and the epitaxial layer 108 can be composed of aluminum gallium arsenide that is 1-20 microns thick.

Typically, the epitaxial layer 108 is epitaxially grown as a crystalline layer on the first side 104 of the substrate 102 to a thickness substantially less than the substrate 102. In such instances, the substrate 102 is also crystalline and is composed of a material having a similar, though not identical, lattice parameter as the epitaxial layer 108. As the lattice parameters are not identical, stresses can occur within the vicinity of the first side 104 of the substrate 102 and the first side 110 of the epitaxial layer 108 causing both the substrate 102 and the epitaxial layer 108 to deviate from planarity (e.g., a bowing distortion).

Each of the arrays of semiconductor devices 100A, 100B further includes a substrate contact 114 abutting the second side 106 of the substrate 102, an epitaxial contact 116 abutting the second side 112 of the epitaxial layer 108, and a submount 118. Typically, the substrate contact 114 and epitaxial contact 116 are operable to direct current to components within the semiconductor device, such as active regions configured to generate light 126 (e.g., including quantum wells) within the epitaxial layer 108. The submount can be a printed circuit board, a lead frame, or a metallic layer intended for further processing, for example.

The submount 118 is mounted to a submount contact with an electrically conductive material 120, such as a fusible metal alloy (e.g., indium-tin solder) or an electrically conductive composite (e.g., silver epoxy). The submount contact is adjacent to the submount 118 and can be either the substrate contact 114 or the epitaxial contact 116 depending on the embodiment. For example, the submount contact is the substrate contact 114 as depicted in FIG. 1A for top-emitting vertical-cavity surface-emitting lasers. In another example, the submount contact is the epitaxial contact 116 as depicted in FIG. 1B for bottom-emitting vertical-cavity surface-emitting lasers.

Each of the arrays of semiconductor devices 100A, 100B further includes an obverse submount contact. The obverse submount contact is the epitaxial contact 116 when the epitaxial contact 116 is not associated with the submount contact as depicted in FIG. 1A. The obverse submount contact is the substrate contact 114 when the substrate contact 114 is not associated with the submount contact as depicted in FIG. 1B.

Both the submount contact and the obverse submount contact (and therefore the substrate contact 114 and the epitaxial contact 116) can be composed of electrically conducting metal. The electrically conducting metal can include an element selected from the group consisting of gold, copper, silver, aluminum, platinum, palladium, rhodium, indium, iridium, gallium, bismuth, antimony, and tin. Both the submount contact and the obverse submount contact can be deposited by chemical vapor deposition (e.g., metalorganic vapor deposition), physical vapor deposition (e.g., electron-beam physical vapor deposition), and/or electrodeposition (e.g., electron Damascene plating). In some instances, the obverse submount contact and/or the submount contact can include metallic barrier films (e.g., tantalum, tantalum nitride) and/or dielectric barriers (silicon nitride).

Each of the arrays of semiconductor devices 100A, 100B further includes a contact extension 122 abutting the obverse submount contact. FIG. 1A depicts the contact extension 122 abutting the epitaxial contact 116 as in this, and similar, implementations the epitaxial contact 116 is the obverses submount contact. FIG. 1B depicts the contact extension 122 abutting the substrate contact 114 as in this, and similar, implementations, the substrate contact 114 is the obverse submount contact.

Figure 1C:
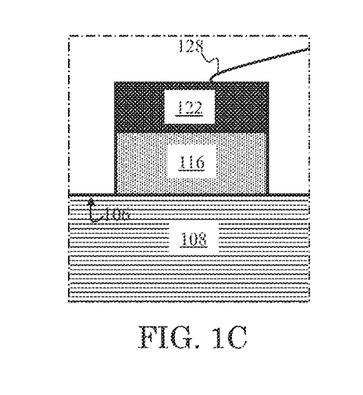
FIG. 1C depicts an enlarged region within the example array of semiconductor devices depicted in FIG. 1A.

In some instances, the contact extension 122 is composed of an electrically conducting metal. The electrically conducting metal can include an element selected from the group consisting of gold, copper, silver, aluminum, platinum, palladium, rhodium, indium, iridium, gallium, bismuth, antimony, and tin. Consequently, the contact extension 122 can be operable to direct current, via an electrical connection 128, to components within the arrays of semiconductor devices 100A, 100B, such as active regions configured to generate light 126 (e.g., including quantum wells) within the epitaxial layer 108 as depicted in FIG. 1C.

Figure 1D:
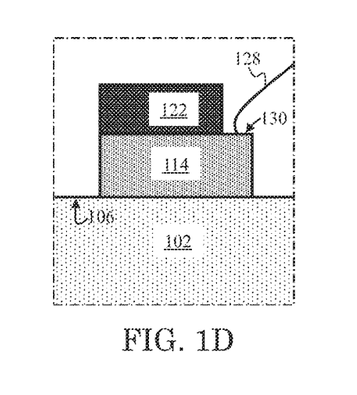
FIGS. 1D and 1E depict enlarged regions within the example array of semiconductor devices depicted in FIG. 1B.

The contact extension 122 need not be operable to direct current to components, however. For example, the substrate contact 114 may include a pad 130 for the electrical connection 128 as depicted in FIG. 1D. Accordingly, the contact extension 122 may be electrically isolated from the substrate contact 114 or even insulating in some implementations.

In some implementations, the contact extension 122 can be composed of the same material as the obverse submount contact and can be deposited by chemical vapor deposition, physical vapor deposition, and/or electrodeposition onto the obverse submount contact. Consequently, the contact extension 122 can be composed of the same material as the obverse submount contact, and can be characterized by a substantially similar microstructure as the obverse submount contact.

However, in some implementations, the contact extension 122 is composed of the same material as the obverse submount contact and can be deposited by different means as the obverse submount contact. For example, in some instances, the obverse submount contact is composed of gold deposited by physical vapor deposition (e.g., electron-beam physical vapor deposition), and the contact extension is composed of gold deposited by electrodeposition. Consequently, the contact extension 122 can be characterized by a substantially dissimilar microstructure as the obverse submount contact. For example, the contact extension 122 may adopt a substantially crystalline or polycrystalline microstructure, and the obverse submount contact may adopt a substantially amorphous microstructure.

Further, in some implementations, the contact extension 122 is composed of a material different from the obverse submount contact and can be deposited by means different from the obverse submount contact. For example, in some instances the obverse submount contact is composed of gold deposited by physical vapor deposition (e.g., electron-beam physical vapor deposition), and the contact extension is composed of copper deposited by electrodeposition. Consequently, the contact extension 122 can be characterized by a substantially dissimilar composition and microstructure as the obverse submount contact.

The contact extension 122 is operable to counteract the intrinsic stresses within the vicinity of the first side 104 of the substrate 102 and the first side 110 of the epitaxial layer 108 such that the array of semiconductor devices 100A, 100B adopts a form that is substantially planar above the melting temperature of the electrically conductive adhesive material 120. The contact extension can be composed of gold from 1 to 30 microns thick in some implementations. However, the operability of the contact extension 122 depends on a number of factors, such as its composition, area, thickness, coefficient of thermal expansion, and the stresses within the vicinity the substrate 102 and epitaxial layer 108 as described above. Further, intrinsic stresses within the contact extension 122 induced by various processing parameters can be tailored to counteract the intrinsic stresses described above. For example, stresses within the microstructure of the contact extension 122 can be introduced by adjusting processing parameters during electrodeposition (e.g., solution pH, impurities, grain size).

Although the contact extension 122 is operable to counteract the intrinsic stresses at elevated temperatures (i.e., at or above the melting temperature of the electrically conductive adhesive 120), the effect must be locked-in place at cooler temperatures. Consequently, the electrically conductive adhesive material 120 is operable to fix the array of semiconductor devices 100A, 100B into a substantially planar form below its melting temperature.

In some implementations, such as the implementations depicted in FIGS. 1A and 1B, each of the arrays of semiconductor devices 100A, 100B further includes a structured extension 124 abutting the submount contact. The structured extension 124 is configured to improve adhesion of the electrically conductive adhesive material 120 and the submount contact. In some instances, the structured extension 124 can also be configured to counteract the intrinsic stresses described above via the same approaches as the contact extension 122.

Figure 1E:
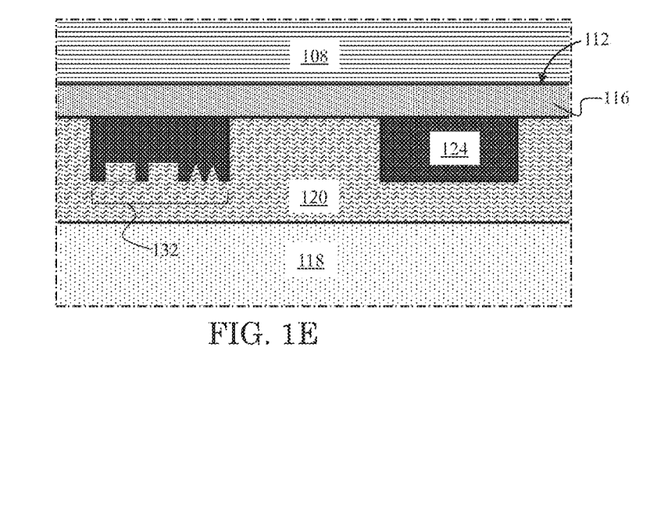

Both the contact extension 122 and the structured extension 124 along with the electrically conductive adhesive material 120 are configured such that the arrays of semiconductor devices 100A, 100B adopt a form that is substantially planar above the melting temperature of the electrically conductive adhesive material 120. Then the electrically conductive adhesive material 120 and the structured extension 124 are operable to fix the array of semiconductor devices 100A, 100B into the form that is substantially planar below the melting temperature of the electrically conductive adhesive material 120. In some instances, the structured extension 124 can include crenelated extensions 132 configured to increase the contact area between the structured extension 124 and the electrically conductive adhesive material 120 as depicted in FIG. 1E.

The arrays of semiconductor devices 100A, 100B further include a plurality of isolating components (not depicted) within the epitaxial layer 108. The plurality of isolating components delineates each semiconductor device within the array of semiconductor devices 100A, 100B. For example, the isolating components within the epitaxial layer 108 can include a dielectric material, such as aluminum oxide. In some instances, the isolating components can include portions of the epitaxial layer characterized by damage caused by ion bombardment. In some instances, the isolating components within the epitaxial layer include removed portions of the epitaxial layer. The removed portions defining mesa structures, wherein each mesa structure delineates one of the semiconductor devices within the array of semiconductor devices.

Figure 2:
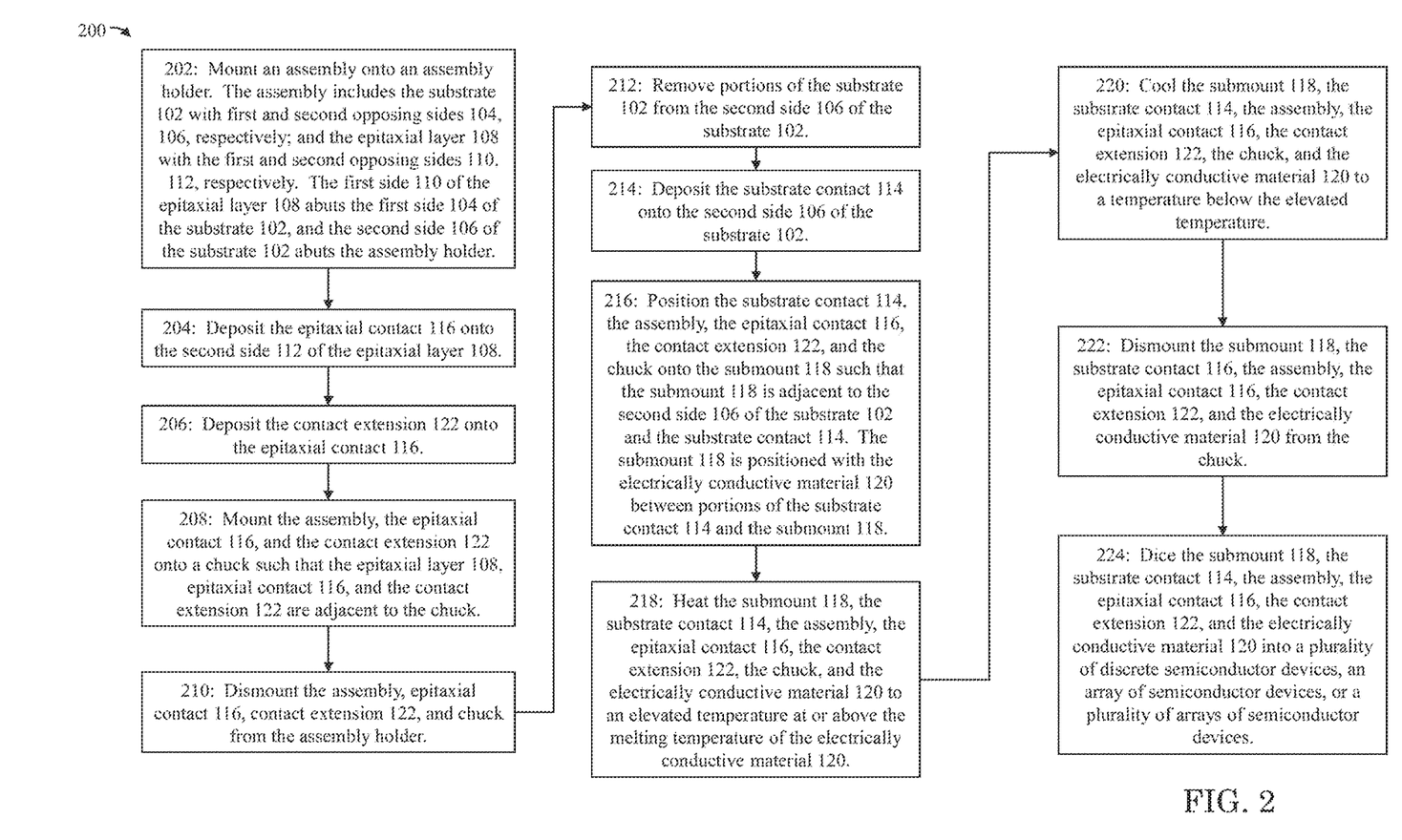
FIG. 2 illustrates an example method for manufacturing a semiconductor device, or arrays of semiconductor devices, such as those depicted in FIG. 1A.

An example method 200 for manufacturing the array of semiconductor devices depicted in FIG. 1A is illustrated in FIG. 2. At 202, an assembly is mounted onto an assembly holder, such as a vacuum chuck. The assembly includes the substrate 102 with first 104 and second 106 opposing sides, and the epitaxial layer 108 with the first 110 and second 112 opposing sides. The first side 110 of the epitaxial layer 108 abuts the first side 104 of the substrate 102, and the second side 106 of the substrate 102 abuts the assembly holder. As described above, the epitaxial layer 108 can be epitaxially grown on the substrate 102 according to methods apparent to a person of ordinary skill in the art.

At 204, the epitaxial contact 116 is deposited onto the second side 112 of the epitaxial layer 108. As described above, the epitaxial contact 116 can be deposited via chemical vapor deposition, physical vapor deposition, and/or electrodeposition. In some instances, the epitaxial contact 116 can be 1000-2000 angstroms, while in other instances, the epitaxial contact 116 can be 5 microns thick or more.

At 206, the contact extension 122 is deposited onto the epitaxial contact 116. As described above, the contact extension 122 can be deposited via chemical vapor deposition, physical vapor deposition, and/or electrodeposition. In some instances, the contact extension 122 can be 1 micron or up to 20 microns, or even 30 microns, thick. In some instances, the epitaxial contact 116 acts a seed layer for the contact extension 122.

At 208, the assembly, the epitaxial contact 116, and the contact extension 122 are mounted onto a chuck (e.g., a vacuum chuck) such that the epitaxial layer 108, epitaxial contact 116, and the contact extension 122 are adjacent to the chuck. In some instances, the assembly, the epitaxial contact 116, and contact extension 122 are mounted onto the chuck with an organic compound positioned between the chuck and the epitaxial layer 108, epitaxial contact 116, and contact extension 122. The organic compound can be a wax, resin, or other formable material designed to minimize damage to the aforementioned components.

At 210, the assembly, epitaxial contact 116, contact extension 122, and chuck are dismounted from the assembly holder.

At 212, portions of the substrate 102 are removed from the second side 106 of the substrate 102. Portions of the substrate 102 can be removed by standard means, such as grinding, lapping, or polishing. For example, the substrate 102 may be 700 microns thick and may subject to grinding, lapping, or polishing until it is 100 to 200 microns thick, for example.

At 214, the substrate contact 114 is deposited onto the second side 106 of the substrate 102. As described above, the substrate contact 114 can be deposited via chemical vapor deposition, physical vapor deposition, and/or electrodeposition. In some instances, the substrate contact 114 is 1000-2000 angstroms, while in other instances, the substrate contact 114 is 5 microns or more. In some instances, a structured extension 124 is deposited onto the substrate contact. The structured extension 124 can be deposited via chemical vapor deposition, physical vapor deposition, and/or electrodeposition. In some instances, the structured extension 124 is 1 micron or up to 20 microns, or even 30 microns, thick. In some instances, the substrate contact 114 acts a seed layer for the structured extension 124. In some instances, the structured extension 124 can be crenelated or structured in other ways to increase the structured extension surface area.

At 216, the substrate contact 114, the assembly, the epitaxial contact 116, the contact extension 122, and the chuck are positioned onto the submount 118 such that the submount 118 is adjacent to the second side 106 of the substrate 102 and the substrate contact 114. The submount 118 is positioned with the electrically conductive material 120 between portions of the substrate contact 114 and the submount 118.

At 218, the submount 118, the substrate contact 114, the assembly, the epitaxial contact 116, the contact extension 122, the chuck, and the electrically conductive material 120 are heated to an elevated temperature at or above the melting temperature of the electrically conductive material 120 for a duration depending on the electrically conductive adhesive material 120. For example, the aforementioned components may be heated to 200° C., 300° C., or even 350° C. for 15 minutes, one hour, or even several hours. In some instances, the aforementioned components may be heated in an inert (e.g., $N_2$, Ar) or reducing atmosphere (e.g., 95:5 $N_2$:H).

At 220, the submount 118, the substrate contact 114, the assembly, the epitaxial contact 116, the contact extension 122, the chuck, and the electrically conductive material 120 are cooled to a temperature below the elevated temperature.

At 222, the submount 118, the substrate contact 116, the assembly, the epitaxial contact 116, the contact extension 122, and the electrically conductive material 120 are dismounted from the chuck.

At 224, the submount 118, the substrate contact 114, the assembly, the epitaxial contact 116, the contact extension 122, and the electrically conductive material 120 are separated (e.g., diced) into a plurality of discrete semiconductor devices, an array of semiconductor devices, or a plurality of arrays of semiconductor devices.

Figure 3:
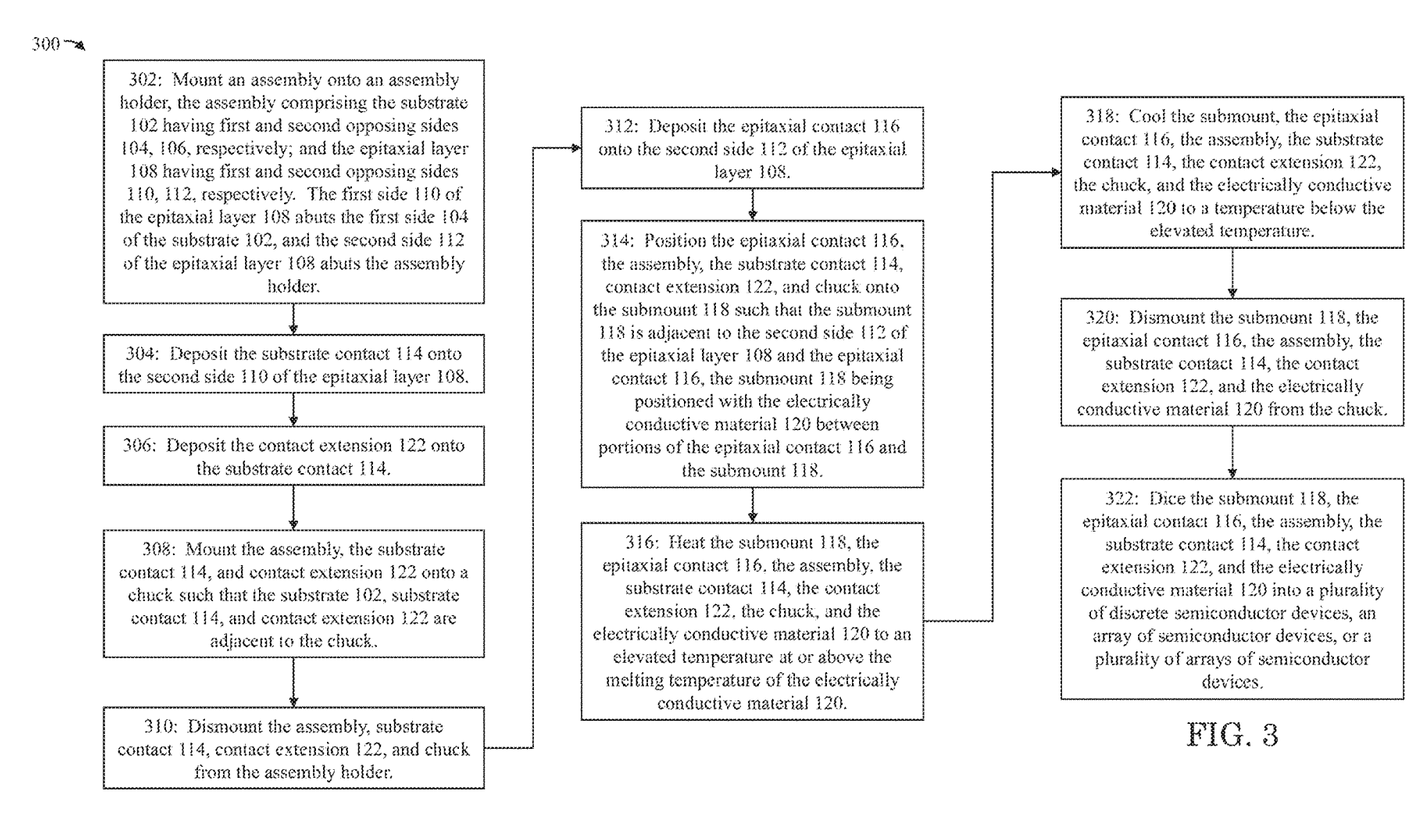
FIG. 3 illustrates an example method for manufacturing a semiconductor device, or arrays of semiconductor devices, such as those depicted in FIG. 1B.

An example method 300 for manufacturing the array of semiconductor devices depicted in FIG. 1B is illustrated in FIG. 3. At 302, an assembly is mounted onto an assembly holder. The assembly includes the substrate 102 with the first 104 and the second 106 opposing sides, and the epitaxial layer 108 with the first 110 and the second 112 opposing sides. The first side 110 of the epitaxial layer 108 abuts the first side 104 of the substrate 102, and the second side 112 of the epitaxial layer 108 abuts the assembly holder. As described above, the epitaxial layer 108 can be grown epitaxially on the substrate 102.

At 304, the substrate contact 114 is deposited onto the second side 110 of the epitaxial layer 108. As described above, the substrate contact 114 can be deposited via chemical vapor deposition, physical vapor deposition, and/or electrodeposition. In some instances, the substrate contact 114 is 1000-2000 angstroms, while in other instances, the substrate contact 114 is 5 microns thick or more.

At 306, the contact extension 122 is deposited onto the substrate contact 114. As described above, the contact extension 122 can be deposited via chemical vapor deposition, physical vapor deposition, and/or electrodeposition. In some instances, the contact extension 122 is 1 microns or up to 20 microns, or even 30 microns, thick. In some instances, the substrate contact 114 acts a seed layer for the contact extension 122.

At 308, the assembly, the substrate contact 114, and contact extension 122 are mounted onto a chuck (e.g., vacuum chuck) such that the substrate 102, substrate contact 114, and contact extension 122 are adjacent to the chuck. In some instances, the assembly, the substrate contact 114, and contact extension 122 are mounted onto the chuck with an organic compound positioned between the chuck and the substrate 102, substrate contact 114, and contact extension 122. The organic compound can be a wax, resin, or other formable material designed to minimize damage to the aforementioned components.

At 310, the assembly, substrate contact 114, contact extension 122, and chuck is dismounted from the assembly holder.

At 312, the epitaxial contact 116 is deposited onto the second side 112 of the epitaxial layer 108. As described above, the epitaxial contact 116 can be deposited via chemical vapor deposition, physical vapor deposition, and/or electrodeposition. In some instances, the epitaxial contact 116 is 1000-2000 angstroms, while in other instances, the epitaxial contact 116 is 5 microns or more. In some instances, a structured extension 124 is deposited onto the epitaxial contact 116. The structured extension 124 can be deposited via chemical vapor deposition, physical vapor deposition, and/or electrodeposition. In some instances, the structured extension 124 is 1 microns or up to 20 microns, or even 30 microns, thick. In some instances, the epitaxial contact 116 acts a seed layer for the structured extension 124. In some instances, the structured extension 124 can be crenelated or structured in other ways to increase the structured extension surface area.

At 314, the epitaxial contact 116, the assembly, the substrate contact 114, contact extension 122, and chuck are positioned onto the submount 118 such that the submount 118 is adjacent to the second side 112 of the epitaxial layer 108 and the epitaxial contact 116. The submount 118 is positioned with the electrically conductive material 120 between portions of the epitaxial contact 116 and the submount 118.

At 316, the submount 118, the epitaxial contact 116, the assembly, the substrate contact 114, the contact extension 122, the chuck, and the electrically conductive material 120 are heated to an elevated temperature at or above the melting temperature of the electrically conductive material 120 for a duration depending on the electrically conductive adhesive material 120. For example, the aforementioned components may be heated to 200° C., 300° C., or even 350° C. for 15 minutes, one hour, or even several hours. In some instances, the aforementioned components may be heated in an inert (e.g., $N_2$, Ar) or reducing atmosphere (e.g., 95:5 $N_2$:H).

At 318, the submount, the epitaxial contact 116, the assembly, the substrate contact 114, the contact extension 122, the chuck, and the electrically conductive material 120 are cooled to a temperature below the elevated temperature.

At 320, the submount 118, the epitaxial contact 116, the assembly, the substrate contact 114, the contact extension 122, and the electrically conductive material 120 are dismounted from the chuck.

At 322, the submount 118, the epitaxial contact 116, the assembly, the substrate contact 114, the contact extension 122, and the electrically conductive material 120 are separated (e.g., diced) into a plurality of discrete semiconductor devices, an array of semiconductor devices, or a plurality of arrays of semiconductor devices.

Other modifications can be made to the foregoing implementations. For example, the foregoing example process may include additional steps such as applying, developing, and removing photoresists; heat treatments (e.g., annealing); planarizing; and soldering. In addition, the semiconductor devices described above may include additional components such as additional electrical connections, current and/or light-defining apertures, and so on. Moreover, features described above in different implementations may be combined in the same implementation. Thus, other implementations are within the scope of the claims.

What is claimed is:

1. A semiconductor device comprising:
    a substrate having first and second opposing sides;
    an epitaxial layer having first and second opposing sides, the first side of the epitaxial layer abutting the first side of the substrate;
    a substrate contact abutting the second side of the substrate;
    an epitaxial contact abutting the second side of the epitaxial layer;
    a submount mounted to a submount contact with an electrically conductive material, the submount contact being either the epitaxial contact or the substrate contact;
    an obverse submount contact, the obverse submount contact being either the epitaxial contact or the substrate contact that is not associated with the submount contact; and
    a contact extension abutting the obverse submount contact,
    wherein the contact extension is operable to counteract intrinsic stresses within a vicinity of the first side of the substrate and the first side of the epitaxial layer such that the semiconductor device adopts a form that is substantially planar above the melting temperature of the electrically conductive material, and wherein intrinsic stresses within the contact extension are induced by various processing parameters and tailored to counteract said intrinsic stresses within the vicinity of the first side of the substrate and the first side of the epitaxial layer.

2. The semiconductor device of claim 1 further including a structured extension abutting the submount contact.

3. The semiconductor device of claim 1, wherein the contact extension is composed of the same material as the obverse submount contact, and the contact extension is characterized by a substantially similar microstructure as the obverse submount contact.

4. The semiconductor device of claim 1, wherein the contact extension is composed of an electrically conducting metal, optionally wherein the electrically conducting metal includes an element selected from the group consisting of gold, copper, silver, aluminum, platinum, palladium, rhodium, indium, iridium, gallium, bismuth, antimony and tin.

5. The semiconductor device of claim 1, wherein the electrically conductive material includes a fusible metal alloy or an electrically conductive composite.

6. The semiconductor device of claim 1, wherein the obverse submount contact is composed of an electrically conducting metal, wherein the electrically conducting metal includes an element selected from the group consisting of gold, copper, silver, aluminum, platinum, palladium, rhodium, indium, iridium, gallium, bismuth, antimony and tin.

7. The semiconductor device of claim 3, wherein the structured extension includes crenelated extensions configured to increase the contact area between the structured extension and the electrically conductive material.

8. The semiconductor device of claim 1, wherein the semiconductor device is a vertical-cavity surface-emitting laser.

9. The semiconductor device of claim 8, wherein the epitaxial layer includes a distributed Bragg reflector and an active region, and the substrate, epitaxial layer, epitaxial contact, substrate contact and submount are operable to generate light.

10. The semiconductor device of claim 8, wherein the vertical-cavity surface-emitting laser is either:
    a top-emitting vertical-cavity surface-emitting laser; or
    a bottom-emitting vertical-cavity surface-emitting laser.

* * * * *